(12) United States Patent
Yang et al.

(10) Patent No.: US 7,327,015 B2
(45) Date of Patent: Feb. 5, 2008

(54) SEMICONDUCTOR DEVICE PACKAGE

(75) Inventors: JunYoung Yang, Paju-Si (KR); KiDon Kim, Paju-Si (KR); JongHo Han, Paju-Si (KR); JunHong Lee, Paju-Si (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 244 days.

(21) Appl. No.: 10/944,198

(22) Filed: Sep. 20, 2004

(65) Prior Publication Data

US 2006/0060953 A1    Mar. 23, 2006

(51) Int. Cl.
*H01L 23/552* (2006.01)

(52) U.S. Cl. .................. 257/660; 257/E23.114

(58) Field of Classification Search ........... 257/659, 257/660; 361/800, 816, 818; 174/350, 377, 174/284; 438/115
See application file for complete search history.

(56) References Cited

U.S. PATENT DOCUMENTS

| | | | | |
|---|---|---|---|---|
| 4,838,475 A | * | 6/1989 | Mullins et al. | 228/179.1 |
| 5,561,265 A | * | 10/1996 | Livshits et al. | 174/386 |
| 5,574,314 A | * | 11/1996 | Okada et al. | 257/728 |
| 5,635,754 A | * | 6/1997 | Strobel et al. | 257/659 |
| 6,075,700 A | * | 6/2000 | Houghton et al. | 361/704 |
| 6,313,621 B1 | * | 11/2001 | Zwack | 324/76.52 |
| 6,613,978 B2 | * | 9/2003 | Czjakowski et al. | 174/388 |
| 6,639,304 B1 | * | 10/2003 | Oggioni et al. | 257/660 |
| 6,650,003 B1 | * | 11/2003 | Benedetto | 257/659 |
| 6,683,245 B1 | * | 1/2004 | Ogawa et al. | 174/382 |
| 6,686,649 B1 | * | 2/2004 | Mathews et al. | 257/659 |
| 6,720,493 B1 | * | 4/2004 | Strobel et al. | 174/388 |
| 6,853,055 B1 | * | 2/2005 | Kuang | 257/659 |
| 6,861,731 B2 | * | 3/2005 | Buijsman et al. | 257/664 |
| 6,947,295 B2 | * | 9/2005 | Hsieh | 361/818 |
| 7,049,682 B1 | * | 5/2006 | Mathews et al. | 257/660 |
| 7,187,060 B2 | * | 3/2007 | Usui | 257/659 |
| 2004/0056334 A1 | * | 3/2004 | Longden et al. | 257/660 |
| 2004/0080917 A1 | | 4/2004 | Steddom et al. | 361/748 |
| 2004/0217454 A1 | * | 11/2004 | Brechignac et al. | 257/678 |
| 2005/0036278 A1 | * | 2/2005 | Murakami et al. | 361/600 |
| 2006/0002099 A1 | * | 1/2006 | Stoneham et al. | 361/816 |

* cited by examiner

*Primary Examiner*—David A. Zarneke
(74) *Attorney, Agent, or Firm*—Pillsbury Winthrop Shaw Pittman, LLP

(57) ABSTRACT

A semiconductor device package includes a semiconductor device mounted to a substrate, a wall erected around the semiconductor device with a height taller than the height of the semiconductor device, at least one metal member provided in the wall or against the wall; and a lid secured to the metal member. The metal member and the lid enclose substantially the semiconductor device for providing electromagnetic interference shielding.

10 Claims, 5 Drawing Sheets

SEMICONDUCTOR DEVICE PACKAGE

BACKGROUND OF THE INVENTION

1. Field of the Invention

This invention relates to semiconductor device packages, and more specifically to semiconductor device packages which are shielded to protect against electromagnetic interference (EMI).

2. Description of the Related Art

Semiconductor device packages typically have electrical circuitry implemented on a circuit substrate, such as a printed circuit board or a ceramic substrate. The performance of the circuitry may be adversely affected by electromagnetic interference (EMI). Electromagnetic interference (EMI) is the generation of undesired electrical signals, or noise, in electronic system circuitry due to the unintentional coupling of impinging electromagnetic field energy.

The coupling of signal energy from an active signal net onto another signal net is referred to as crosstalk. Crosstalk is within-system EMI, as opposed to EMI from a distant source. Crosstalk is proportional to the length of the net parallelism and the characteristic impedance level, and inversely proportional to the spacing between signal nets.

Electronic systems are becoming smaller, and the density of electrical components in these systems is increasing. As a result, the dimensions of the average circuit element is decreasing, favoring the radiation of higher and higher frequency signals.

At the same time, the operating frequency of these electrical systems is increasing, further favoring the incidence of high frequency EMI. EMI can come from electrical systems distant from a sensitive receiving circuit, or the source of the noise can come from a circuit within the same system (crosstalk or near source radiated emission coupling). The additive effect of all these sources of noise is to degrade the performance, or to induce errors in sensitive systems.

SUMMARY OF THE INVENTION

It is therefore an object of the present invention to provide semiconductor device packages which are shielded to protect against electromagnetic interference (EMI).

To achieve the above listed and other objects, a semiconductor device package having features of the present invention generally includes a semiconductor device mounted to a substrate, a wall erected around the semiconductor device with a height taller than the height of the semiconductor device, at least one metal member provided in the wall or against the wall; and a lid secured to the metal member. Note that the metal member and the lid enclose substantially the semiconductor device for providing electromagnetic interference shielding. Preferably, the wall is integrally formed with the substrate.

In accordance with the present invention, there is provided another semiconductor device package includes a semiconductor device mounted to a substrate having at least one metal member provided therein and a metal cover secured to the metal member thereby enclosing substantially the semiconductor device for providing electromagnetic interference shielding.

In accordance with the present invention, there is provided another semiconductor device package includes a semiconductor device mounted to a substrate and a metal cover secured to the substrate for providing electromagnetic interference shielding. Specifically, the metal cover has a base portion and a side wall extending from the base portion, and the size of the side wall is slightly larger than the size of a top portion of the substrate to enable the top portion of the substrate to be received within the metal cover. The side wall of the metal cover abuts the bottom portion of the substrate when the top portion of the substrate is received within the metal cover.

In accordance with the present invention, the lid may be a metal plate or a film with a conductive coating thereon. The metal member may be a metal ring or four metal bars arranged around the semiconductor device. Preferably, the metal member is connected to ground potential. The substrate may be an organic substrate or a ceramic substrate.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

Figure 1:
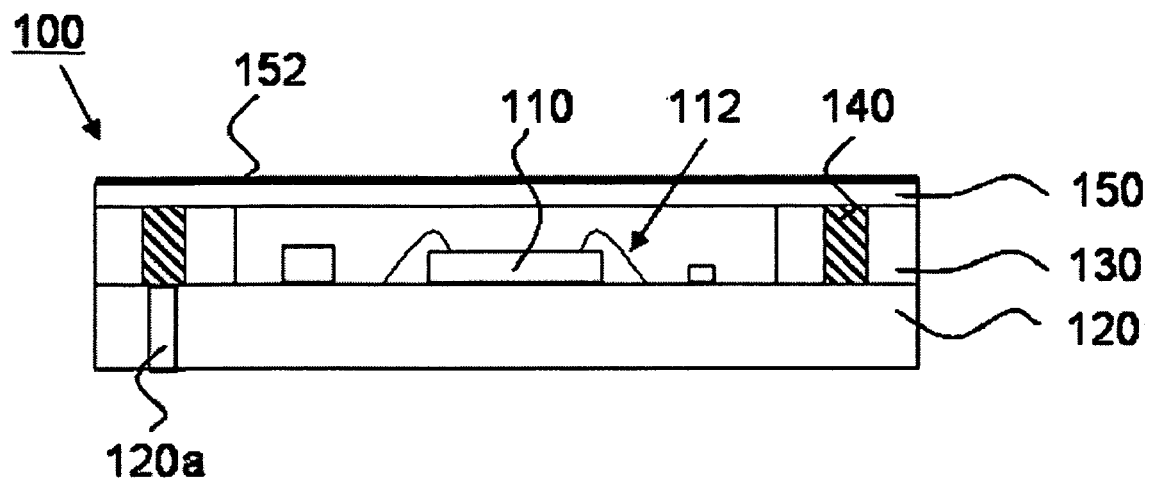
FIG. 1 is a cross sectional view of a semiconductor device package according to one embodiment of the present invention.

FIG. 1 illustrates a semiconductor device package 100 according to one embodiment of the present invention. The package 100 includes a semiconductor device 110 attached to a substrate 120 by means of a conductive adhesive (not shown) such as a silver-filled epoxy or a non-conductive adhesive (not shown). As shown, the semiconductor device 110 is connected to the substrate 120 by a plurality of bonding wires 112 which act as electrical input/output (I/O) connections to conductive traces or pads (not shown) of the substrate 120. Alternatively, the semiconductor device 110 may be connected to the substrate 120 by a plurality of solder balls. The solder balls may be formed on an active surface of the semiconductor device 110 using one of any known bumping procedures.

Referring to FIG. 1, the package 100 is provided with a wall 130 erected from the periphery of the substrate 120 with a height taller than the height of the semiconductor device 110. Note that a metal member 140 is provided in the wall 130, and a lid such as a metal plate 150 sized and dimensioned to engage the wall 130, preferably without extending thereover. Alternatively, the lid may be a film with a conductive coating thereon. The metal plate 150 is suitably bonded to the wall 130 to hermetically close the semiconductor device 110 therein. In this way, the semiconductor device 110 is EMI shielded by the metal member 140 and the metal plate 150. The metal plate 150 may be secured to the metal member 140 by a soldering interface (e.g., Au—Sn solder), a conductive adhesive interface, or resistance welding. Both the metal member 140 and the metal plate 150 may be constructed from silver or copper to effectively reduce the amount of radiation which can penetrate therethrough thereby reducing the total dose radiation received at the semiconductor device 110 to a level less than the total dose tolerance of the semiconductor device 110. Preferably, the upper surface of the metal plate 150 has a solder layer 152 (or a black-oxidation layer) formed thereon for mark ability.

The substrate 120 may be an organic substrate formed from a core layer made of fiberglass reinforced BT (bismaleimide-triazine) resin or FR-4 fiberglass reinforced epoxy resin. Alternatively, the substrate 120 may be a multi-layer ceramic substrate. Preferably, the substrate 120 and the wall 130 are integrally formed by a LTCC (Low Temperature Cofired Ceramic) manufacturing process.

Figure 2:
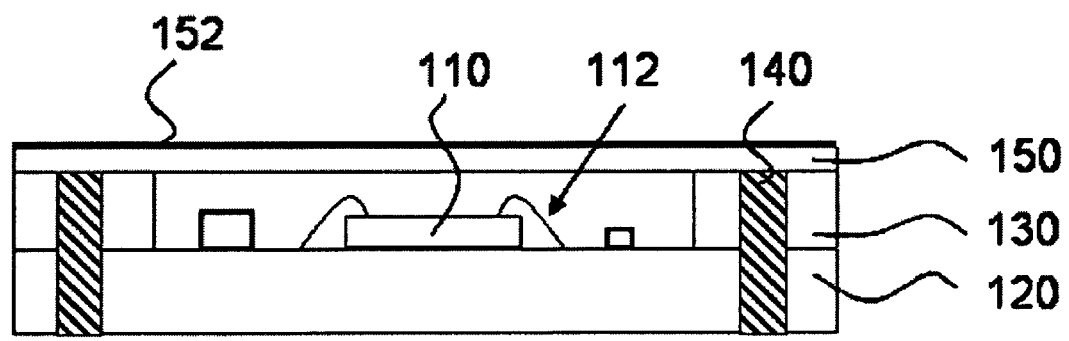
FIG. 2 is a cross sectional view of a semiconductor device package according to another embodiment of the present invention.

Alternatively, as shown in FIG. 2, the metal member 140 may extend from the wall 130 into the substrate 120 for providing better EMI shielding.

Figure 3:
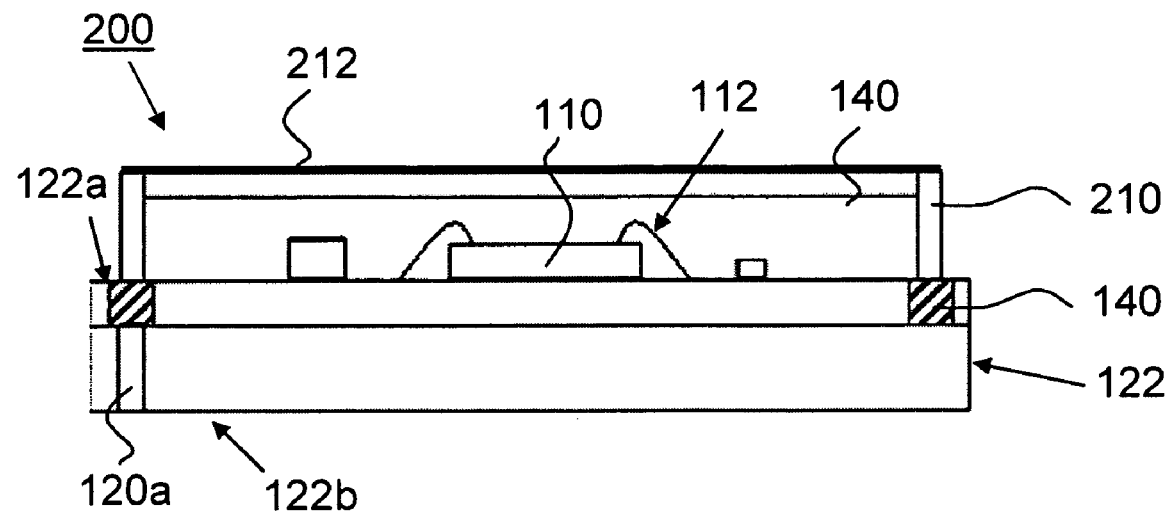
FIG. 3 is a cross sectional view of a semiconductor device package according to another embodiment of the present invention.

FIG. 3 illustrates a semiconductor device package 200 according to another embodiment of the present invention. The package 200 includes a semiconductor device 110 attached to and electrically coupled to a substrate 122. As shown, the metal member 140 is provided in the substrate 122, and the package 120 is provided with a metal cover 210 secured to the metal member 140 thereby enclosing substantially the semiconductor device 110 for providing electromagnetic interference shielding.

Preferably, the upper surface of the metal cover 210 has a solder layer 212 (or a black-oxidation layer) formed thereon for mark ability. The metal cover 210 may be secured to the metal member 140 by a soldering interface (e.g., Au—Sn solder), a conductive adhesive interface, or resistance welding. Both the metal member 140 and the metal cover 210 may be constructed from silver or copper to effectively reduce the amount of radiation which can penetrate therethrough thereby reducing the total dose radiation received at the semiconductor device 110 to a level less than the total dose tolerance of the semiconductor device 110.

Figure 4:
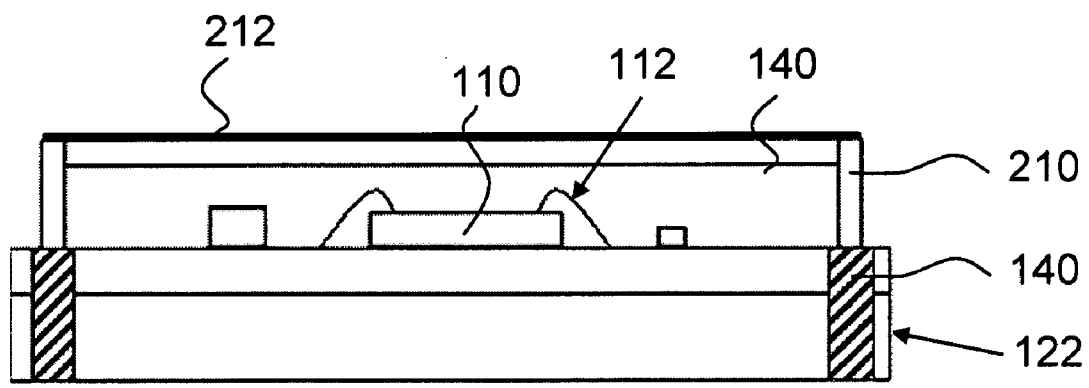
FIG. 4 is a cross sectional view of a semiconductor device package according to another embodiment of the present invention.

Alternatively, as shown in FIG. 4, the metal member 140 may extend from an upper surface 122a to a lower surface 122b of the substrate 122 for providing better EMI shielding.

Figure 5:
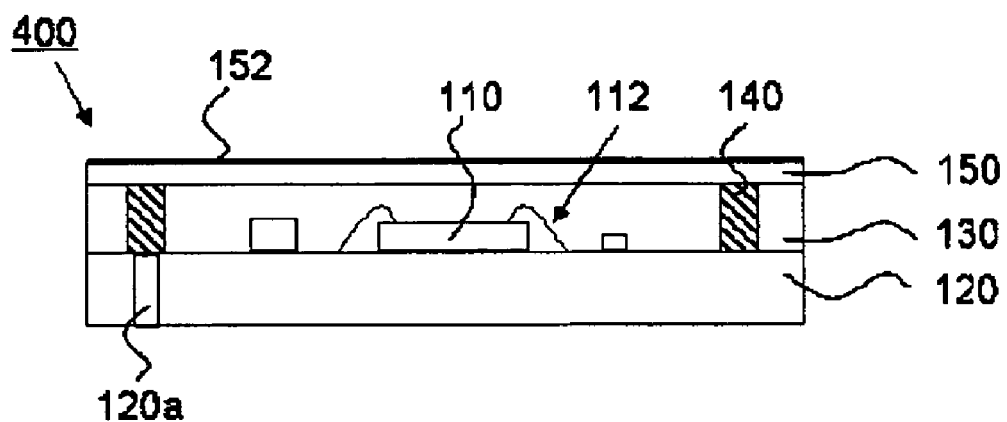
FIG. 5 is a cross sectional view of a semiconductor device package according to another embodiment of the present invention.
Figure 6:
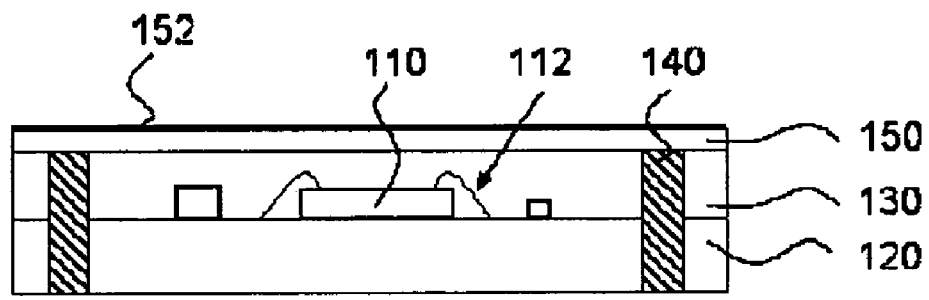
FIG. 6 is a cross sectional view of a semiconductor device package according to another embodiment of the present invention.

FIG. 5 illustrates a semiconductor device package 400 according to another embodiment of the present invention. The package 400 is substantially identical to the package 100 shown in FIG. 1 except that the metal member 140 is not provided in the wall 130 but provided against the inner surface of the wall 130. Alternatively, as shown in FIG. 6, the metal member 140 may extend from the wall 130 into the substrate 120 for providing better EMI shielding.

Preferably, the metal member 140 shown in FIGS. 1-6 is connected to ground potential. Specifically, the metal member 140 may be connected to one independent grounding portion (not shown) provided in the substrate 120 or the substrate 122 by a dedicated vertical terminal such as via 120a (see FIG. 1, FIG. 3 and FIG. 5). The grounding portion may be distributed in the substrate 120 or the substrate 122 in any available location, and is electrically joined to an electrical ground of an external printed circuit (PC) main board (not shown) for supplying ground potential. In the embodiments shown in FIG. 2, FIG. 4 and FIG. 6, the metal member 140 may be directly connected to one independent grounding portion (not shown) provided in the substrate 120 or the substrate 122.

Figure 7:
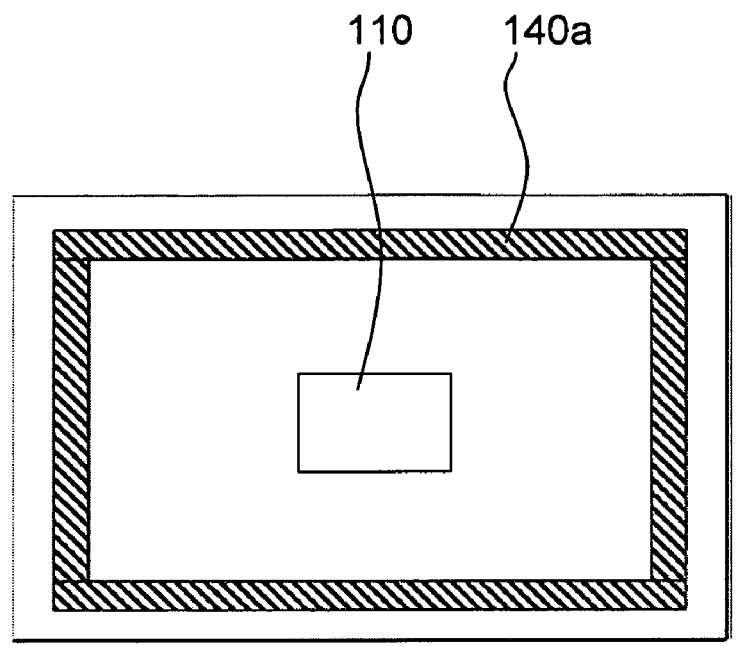
FIG. 7 is a top plan view of a semiconductor device package showing a metal ring and a semiconductor device provided in the metal ring according to one embodiment of the present invention.
Figure 8:
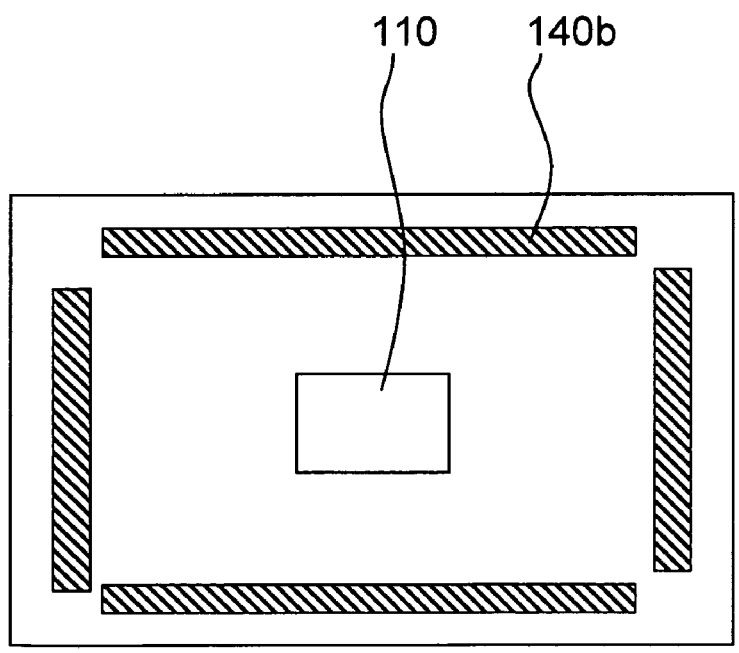
FIG. 8 is a top plan view of a semiconductor device package showing four metal bars arranged around a semiconductor device according to another embodiment of the present invention.

Note that the metal member 140 shown in FIGS. 1-6 may be a metal ring 140a shown in FIG. 7 or metal bars 140b arranged around the semiconductor device 110 as shown in FIG. 8.

Figure 9:
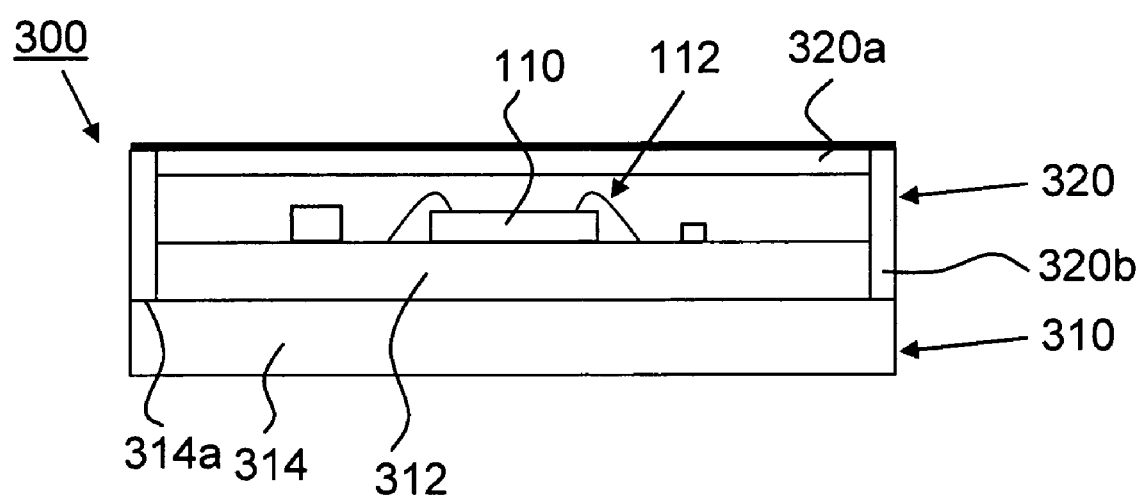
FIG. 9 is a cross sectional view of a semiconductor device package according to another embodiment of the present invention

FIG. 9 illustrates a semiconductor device package 300 according to another embodiment of the present invention. The package 300 includes a semiconductor device 110 mounted to a substrate 310 and a metal cover 320 secured to the substrate 310 for providing electromagnetic interference shielding. Specifically, the substrate 310 includes a top portion 312 and a bottom portion 314, wherein the size of the bottom portion 314 is larger than the size of the top portion 312. The metal cover 320 has a base portion 320a and a side wall 320b extending from the base portion 320a, and the size of the side wall 320b is slightly larger than the size of the upper portion 310a of the substrate 310 to enable the upper portion 310a to be received within the metal cover 320. The side wall 320b of the metal cover 320 abuts the bottom portion 314 of the substrate 310 when the top portion 312 of the substrate 310 is received within the metal cover 320. Preferably, the metal cover 320 may be connected to one independent grounding portion (not shown) provided in the substrate 310 by a dedicated vertical terminal provided in the bottom portion 314 of the substrate 310 or a dedicated conductive trace extending on the bottom portion 314 of the substrate 310 (not shown in FIG. 7). The metal cover 320 may be secured to the dedicated vertical terminal or the dedicated conductive trace by a soldering interface (e.g., Au—Sn solder) 314a. The soldering interface 314a may be replaced by a conductive adhesive interface. The grounding portion may be distributed in the substrate 310 in any available location, and is electrically joined to an electrical ground of an external printed circuit (PC) main board (not shown) for supplying ground potential.

Although the invention has been explained in relation to its preferred embodiments, it is to be understood that many other possible modifications and variations can be made without departing from the spirit and scope of the invention as hereinafter claimed.

What is claimed is:

1. A semiconductor device package comprising:
   a substrate;
   a semiconductor device mounted to the substrate and electrically coupled to the substrate;
   a wall erected around the semiconductor device with a height taller than the height of the semiconductor device;
   at least one metal member provided in the wall; and
   a lid secured to the metal member such that the lid is electrically connected to the metal member directly,
   wherein the metal member and the lid substantially enclose the semiconductor device for providing electromagnetic interference shielding.

2. The semiconductor device package as claimed in claim 1, wherein the lid is a metal plate or a film with a conductive coating thereon.

3. The semiconductor device package as claimed in claim 1, wherein the metal member is connected to ground potential.

4. The semiconductor device package as claimed in claim 1, wherein the metal member is a metal ring.

5. The semiconductor device package as claimed in claim 1, wherein the metal member comprises a plurality of metal bars arranged around the semiconductor device.

6. The semiconductor device package as claimed in claim 1, wherein the metal member extends from the wall into the substrate.

7. The semiconductor device package as claimed in claim 1, wherein the substrate is an organic substrate or a ceramic substrate.

8. The semiconductor device package as claimed in claim 1, wherein the wall is integrally formed with the substrate.

9. The semiconductor device package as claimed in claim 1, wherein the lid is secured to the metal member by a soldering interface.

10. The semiconductor device package as claimed in claim 1, further comprising a solder layer or a black-oxidation layer formed on the lid.

* * * * *